(12) United States Patent
Moffatt (10) Patent No.: US 8,404,499 B2
(45) Date of Patent: Mar. 26, 2013

(54) LED SUBSTRATE PROCESSING

(75) Inventor: Stephen Moffatt, St. Brelade (JE)

(73) Assignee: Applied Materials, Inc., Santa Clara, CA (US)

( * ) Notice: Subject to any disclaimer, the term of this patent is extended or adjusted under 35 U.S.C. 154(b) by 254 days.

(21) Appl. No.: 12/761,319

(22) Filed: Apr. 15, 2010

(65) Prior Publication Data

US 2010/0267174 A1  Oct. 21, 2010

Related U.S. Application Data

(60) Provisional application No. 61/171,020, filed on Apr. 20, 2009.

(51) Int. Cl.
   *H01L 21/66* (2006.01)
(52) U.S. Cl. .......................................... 438/16; 219/390
(58) Field of Classification Search .................. 438/16; 219/390
   See application file for complete search history.

(56) References Cited

U.S. PATENT DOCUMENTS

| | | | | |
|---|---|---|---|---|
| 4,421,592 A | * | 12/1983 | Shuskus et al. | 117/103 |
| 4,836,138 A | * | 6/1989 | Robinson et al. | 118/666 |
| 5,005,519 A | * | 4/1991 | Egermeier et al. | 118/722 |
| 6,740,906 B2 | * | 5/2004 | Slater et al. | 257/99 |
| 7,173,216 B2 | | 2/2007 | Ptak | |
| 7,514,305 B1 | * | 4/2009 | Hawryluk et al. | 438/166 |
| 7,977,258 B2 | * | 7/2011 | Nenyei et al. | 438/795 |
| 2004/0026400 A1 | * | 2/2004 | Ptak | 219/390 |
| 2008/0265789 A1 | * | 10/2008 | Bertram et al. | 315/185 R |

FOREIGN PATENT DOCUMENTS

| | | |
|---|---|---|
| JP | 2006-059931 A | 3/2006 |
| JP | 2008-016545 A | 1/2008 |

OTHER PUBLICATIONS

International Search Report for PCT application PCT/US2010/031403 (Oct. 29, 2010).

* cited by examiner

*Primary Examiner* — David Vu
*Assistant Examiner* — Caleb Henry
(74) *Attorney, Agent, or Firm* — Kilpatrick Townsend & Stockton LLP (57) ABSTRACT

Embodiments of the present invention pertain to substrate processing equipment and methods incorporating light emitting diodes (LEDs) for thermally processing substrates. Such light sources offer a variety of advantages including higher efficiency and more rapid response times. Pulse widths are selectable down to under a millisecond but can be for long pulses up to and exceeding a second. LEDs are preferable to tungsten-halogen lamps even in circumstances that allow longer processing times, since LEDs produce light with greater than 50% efficiency and tungsten-halogen lamps operate with less than 5% efficiency.

25 Claims, 6 Drawing Sheets

LED SUBSTRATE PROCESSING

CROSS-REFERENCE TO RELATED APPLICATIONS

This application claims the benefit of U.S. Provisional Application No. 61/171,020, filed Apr. 20, 2009, which is incorporated herein by reference in its entirety for all purposes.

BACKGROUND OF THE INVENTION

In some processes used in the semiconductor industry, it is desirable to heat a substrate rapidly to reduce the time it takes to process the substrate. Typically, rapid thermal processing systems utilize a high intensity light source to rapidly heat a substrate that is held within a processing chamber, sometimes under vacuum conditions. The high intensity light source, which may consist of an array of high intensity lamps, is located inside the chamber or outside of the chamber and adjacent to a transparent window through which the light passes into the chamber. Inside of the chamber the substrate is supported with very little physical contact (usually around the edge) so the substrate temperature can respond quickly to the incoming light. The front of the wafer is exposed and receives light from the high intensity lamps. The lamps are essentially black-body radiators and are heated as quickly as possible (typically 300 to 500 ms) to operating temperature. For many substrates, like silicon substrates as commonly used in the manufacture of integrated circuits, optical absorption is higher for shorter wavelengths especially at the beginning of a heating cycle when the substrate is closer to room temperature. Rapid silicon substrate heating begins after the lamps reach high temperatures (about 3000° C.) at which time the lamps begin emitting a significant portion of short wavelength light.

Figure 1:
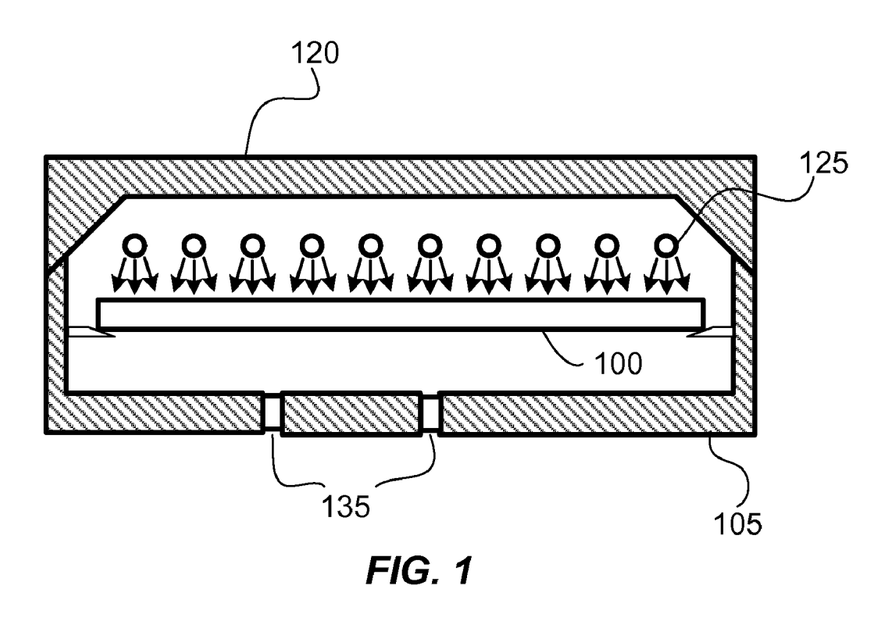
FIG. 1 is a cross-sectional schematic of a heating and monitoring system in a prior art substrate processing system.

FIG. 1 shows a schematic cross-sectional view of a flood type rapid thermal heating apparatus in which a wafer 100 disposed in chamber 105 is heated by radiation from lamps 125 mounted on a chamber lid 120. The lamps 125 are typically tungsten-halogen lamps and may be brought to different temperatures to even the heat profile of the substrate. Pyrometry measurements may be made by monitoring light through windows 135 in the chamber 105. The rate with which the lamps 125 can be switched on is limited with typical heat lamps and results in limitations on how fast a substrate can be heated. A practical minimum for pulse duration using tungsten-halogen lamps is about 1 sec due to the reaction time of the filament.

Alternative light sources have been used to improve efficiency and to provide shorter pulse durations in order to stay within processing time targets. Flash lamps, which provide pulse durations of 100 µs to 1 ms, have a shorter pulse duration. However, when using flash lamps to heat a substrate, the maximum temperature of the substrate, or that of its near surface region, is limited by the pulse duration.

High efficiency lamps are lacking for pulse durations above about 1 ms. Therefore, high intensity substrate illumination sources which can provide pulse durations between about 1 ms and 1 sec are needed.

BRIEF SUMMARY OF THE INVENTION

Embodiments of the present invention pertain to substrate processing equipment and methods incorporating light emitting diodes (LEDs) for thermally processing substrates. Such light sources offer a variety of advantages including higher efficiency and more rapid response times. Pulse widths are selectable down to under a millisecond but can be for long pulses up to and exceeding a second. LEDs are preferable to tungsten-halogen lamps even in circumstances that allow longer processing times, since LEDs produce light with greater than 50% efficiency and tungsten-halogen lamps operate with less than 5% efficiency.

An substrate processing system includes a plurality of light emitting diodes for illuminating a first surface of the substrate in order to modify the substrate, wherein illumination from the light emitting diodes includes one or more pulses of light near one or more wavelengths. The plurality of light emitting diodes can modify a near surface region of substrate. The one or more pulses of light have a duration can range between about 1 millisecond and about 1 second or can range between about 10 microseconds and about 1 millisecond, or can be greater than about 1 second. The one or more pulses of light can have a peak optical power of greater than 500 Watts/cm$^2$. The first surface of the substrate can be greater than 100 cm$^2$. The plurality of light emitting diodes can be formed on a single transparent substrate.

In another embodiment, a substrate processing system includes a substrate support assembly for supporting the substrate disposed within a processing chamber, and a first light emitting diode assembly. The first light emitting diode assembly further includes a plurality of light emitting diodes disposed near a first surface of the substrate for illuminating the first surface in order to modify the substrate, wherein illumination from the light emitting diodes includes pulses of light near one or more wavelengths. The plurality of light emitting diodes can modify a near surface region of substrate. The pulses of light can have a duration between about 1 millisecond and about 1 second. The pulses of light can have a peak optical power that is greater than 200 Watts/cm$^2$. The optical pulses can modify the substrate by activating a dopant within the substrate. The optical pulses can modify the substrate by diffusing atoms into the substrate. The substrate processing system can further include a second light emitting diode assembly including a second plurality of light emitting diodes disposed near a second surface of the substrate for illuminating the second surface of the substrate.

In another embodiment, a method of treating a substrate includes providing a substrate, selecting a LED pulse duration and a LED pulse intensity of at least one optical pulse sufficient to treat a substrate, and treating the substrate with at least one optical pulse of light from an LED assembly. The at least one optical pulse includes one or more LED wavelengths.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

A further understanding of the nature and advantages of the invention may be realized by reference to the remaining portions of the specification and the drawings, presented below. The Figures are incorporated into the detailed description portion of the invention.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

Embodiments of the present invention pertain to substrate processing equipment and methods incorporating light emitting diodes (LEDs) for thermally processing substrates. Such light sources offer a variety of advantages including higher efficiency and more rapid response times. Pulse widths are selectable and can range to less than a millisecond to more than a second. LEDs are preferable to tungsten-halogen lamps even in circumstances that allow longer processing times, since LEDs produce light with greater than 50% efficiency and tungsten-halogen lamps operate with less than 5% efficiency.

In a disclosed embodiment, light emitting diodes are used to illuminate and heat the surface of a substrate to process the near surface region of the substrate. The processes include forming films, treating dopants and reordering the substrate itself. Substrate processing has been enabled for some processes, due to the availability of HR-LEDS, and many more processes may benefit from HR-LEDS as even higher output intensities become available. High-radiance light emitting diodes (HR-LEDS) offer advantages when used to process the near surface region of a substrate. HR-LEDS last a long time and allow the output intensity to be chosen independent from the wavelength(s) of the output illumination. Light emitting diodes (LEDs) may consist of gallium nitride, aluminum nitride, combinations thereof or other III-V materials grown on a transparent substrate constructed to emit light close to one or more wavelengths determined by the bandgap of III-V materials in the active region. A phosphor may also be used to convert an emitted wavelength to a longer wavelength, reducing the energy of an emitted wavelength. It will be understood that LEDs described herein and depicted in the remaining figures may employ a phosphor in order to enhance absorption or enhance a chemical reaction.

Depending on the chemistries involved, illuminating a surface in the presence of gas precursor can enhance the rate of chemical reactions by thermal or other means. For example, the light may excite gas phase molecules, adsorbed molecules, or even electronically excite the substrate to promote a chemical reaction on the surface. The wavelength of the LED may be selected to promote desirable film processes by, for example, choosing a wavelength which is resonant with a molecular electronic transition in order to enhance a reaction rate. The wavelength may also be chosen to enhance absorption of the radiation by the substrate, thereby heating the substrate more efficiently.

Individual high radiance (HR) LEDs are currently available which emit more than 10 Watts of power continuously. The availability of ever higher powers is anticipated in the coming years which will enable an LED to further replace incandescent bulbs. One advantage of using LEDs is that the small size of LEDs allows them to be arranged in one and two dimensional arrays producing high intensity sources suitable for substantially illuminating a surface of a substrate simultaneously. Suitable LED assemblies are disclosed herein for emitting optical power greater than 200 Watts/cm$^2$, greater than 500 Watts/cm$^2$ or greater than 1000 Watts/cm$^2$, in different embodiments.

A wide variety of deposition, annealing and other heat treatments for Si wafers benefit from short heating cycles. Flash lamp based systems can operate with pulse durations in the 100 µs to 1 ms time range whereas traditional RTP lamp based systems operate with pulse durations between 1 and 100 seconds. Traditional RTP lamps emit power continuously and are bounded by the response time of the lamp and wafer. Since LED lamp based systems operate with pulse durations between 1 millisecond and 1 second, LED lamp based systems advantageously fill in the gap between flash lamp systems and traditional RTP lamp systems. LED lamp based systems, which can heat rapidly since they emit short wavelength radiation several microseconds after power is applied, allows substrates or near surface regions of the substrate to be heated for pulse durations previously unattainable (e.g. between 1 millisecond and 1 second). Processing a substrate between 1 milliseconds and 1 second further reduces the time it takes to process a substrate and increases the throughput of the semiconductor apparatus processing the substrate. For pulses in the low end of the LED range, below about 10-20 milliseconds, typical substrates do not have time to equilibrate so the top of the substrate may be at a different temperature than the bottom of the substrate during the pulse.

In addition to being able to control pulse duration, repetition rate, number of repetitions and intensity, LEDs will allow the optical pulse shape to be varied by simply controlling the voltage applied to the diodes. Pulse shaping allows the heating rate to be engineered to balance process efficiency and the stress gradients in deposited films and the wafer both during and after the process.

LEDs can also provide benefits when processing substrates outside the time region ranging from 1 millisecond to 1 second. In some embodiments, LEDs may be used to produce pulses under 1 milliseconds down to the time required to initiate illumination, which may be less than 10 microseconds. These LED pulses partially overlap the pulse regime covered by flash lamps. In other embodiments, LEDs can be used for pulse durations smaller than the limit of flash lamps. The illumination from LEDs is based on the driving voltage which allows pulse durations and duty cycles unattainable with flash lamps and Q-switched lasers which require a repopulation of excited states. In some embodiments, the LEDs are operated in a continuous operation Mode. For pulses higher than one second, LEDs are preferable to tungsten-halogen incandescent lamps since the operational efficiency of LEDs is at least about one order of magnitude higher than the operational efficiency of tungsten-halogen incandescent lamps.

Figure 2A:
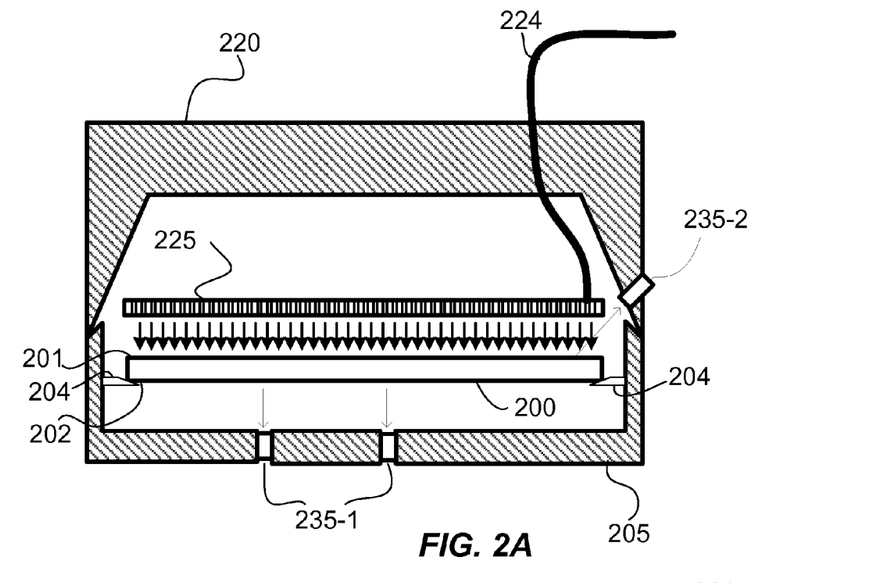
FIGS. 2A-2B are cross-sectional schematics of a substrate processing system and a light emitting component according to embodiments of the invention.
Figure 2B:
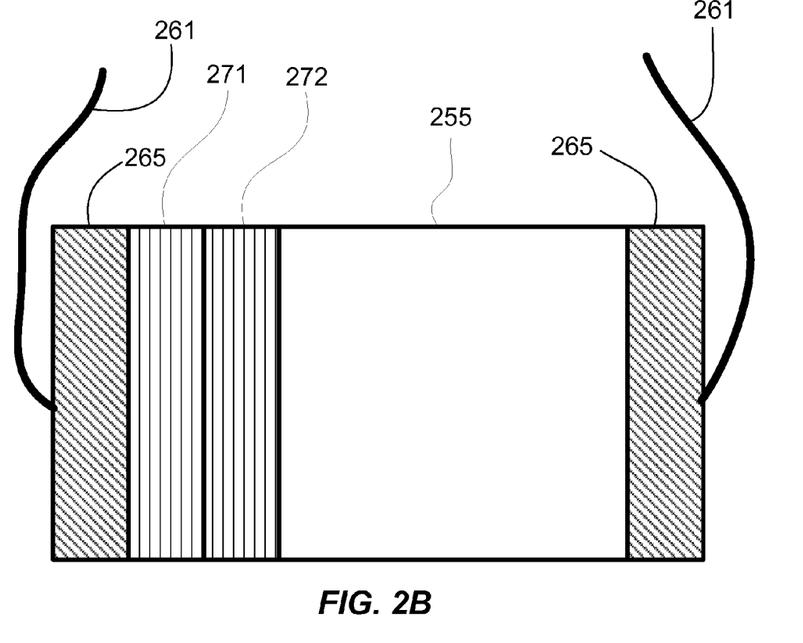

In order to better understand and appreciate the invention reference is made to FIGS. 2A and 2B which are cross-sectional schematics of a substrate processing system incorporating a light emitting component according to embodiments of the invention. A light emitting diode (LED) assembly 225 is positioned above a substrate 200 in a chamber 205. Electrical connections 224 are fed through a lid 220 which may also physically support the LED assembly 225. The electrical connections 224 deliver power to each LED in an array of LEDs which form the LED assembly 225. A voltage is supplied to the LED assembly 225 which then illuminates and heats the front 201 of the substrate 200. In some embodiments, an area of at least 100 cm$^2$ is illuminated.

During processing, pyrometers 235-1 and 235-2 sense the temperature of the substrate 200 at a variety of locations on the back 202 and front 201 of the substrate 200 which can be used to help determine the voltage delivered to the LED assembly 225 dynamically. Alternatively, the temperature can be used to determine the voltage applied to the LED assembly 225 for subsequent wafers. These two control implementations are variations on feedback control. The substrate may be supported with little contact by support mechanisms 204 around the edge of the substrate. Support may be provided in the form of a continuous ring in the case of a circular substrate or discrete tabs distributed around the edge for circular or rectangular substrates. Supporting the substrate in this manner reduces the thermal load and as a result, the power required by the LED assembly 225 in order to heat the substrate 200 to a selected temperature.

Pyrometers 235-1 and 235-2 may detect light of a different wavelength than the light from LED assembly 225 used to illuminate and heat the substrate resulting in a more accurate determination of substrate temperature. Accuracy is enhanced when the pyrometers 235-1 and 235-2 are configured to avoid detecting reflected or scattered light from the surface of the substrate or another object within the processing chamber 205. Scattered or reflected light, originating from the LEDs, is not indicative of the temperature of the substrate and may result in an incorrect determination of the substrate temperature. In an embodiment relevant for a silicon substrate, a wavelength generated by LED assembly 225 may be below about 0.75 m while a wavelength detected by the pyrometers 235-1 and 235-2 is between about 0.75 μm and 1.2 μm. In another silicon substrate embodiment, the LED assembly 225 emits light below about 0.5 μm and the pyrometers 235-1 and 235-2 may detect light between about 0.5 μm and 1.2 μm.

The LED assembly can contain many more LEDs than tungsten-halogen lamps, enabling similar power densities to be achieved. For the same power output, LEDs generate about ten times less heat than state-of-the-art tungsten-halogen bulbs, however, the LED assembly may still be water cooled on the backside with a recirculating flow (not shown) to increase the life span of the LED components. Power distribution to the LEDs within the LED assembly 225 may involve free wires heading to each diode or wires affixed to the diode assembly. An optical diffuser may be positioned between the LEDs and the substrate to even out the spatial distribution of the optical intensity at the surface of the substrate. Optical diffusers may be made from precision ground transparent windows.

An exemplary element in the array of LEDs which form the LED assembly 225 is shown in FIG. 2B. Electrical leads 261 are attached to either side of an LED stack through conducting pads 265. A higher voltage may be applied to the left side relative to the right side creating a voltage difference at the interface between a p-doped gallium nitride layer 271 and an n-doped gallium nitride layer 272 causing light to be emitted from near the interface (the active region). High radiance LEDs may involve more complex active regions than the one depicted in FIG. 2B but the architecture will still involve the formation of doped layers on a transparent substrate 255. Illumination from the active region propagates generally within the plane of the transparent substrate 255, confined by the opaque layers and reflective interfaces which result in the emission of light downward toward the substrate (FIG. 2A). This is one exemplary architecture employing an LED assembly to modify the near surface region of a substrate.

Figure 3A:
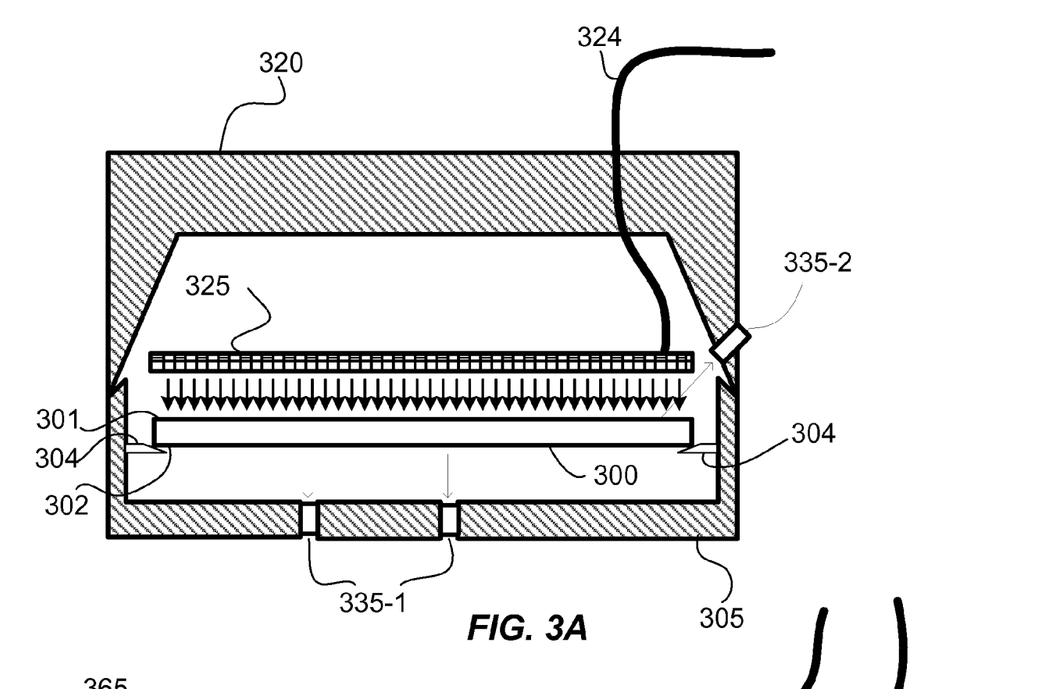
FIGS. 3A-3B are cross-sectional schematics of a substrate processing system and a light emitting component according to embodiments of the invention.
Figure 3B:
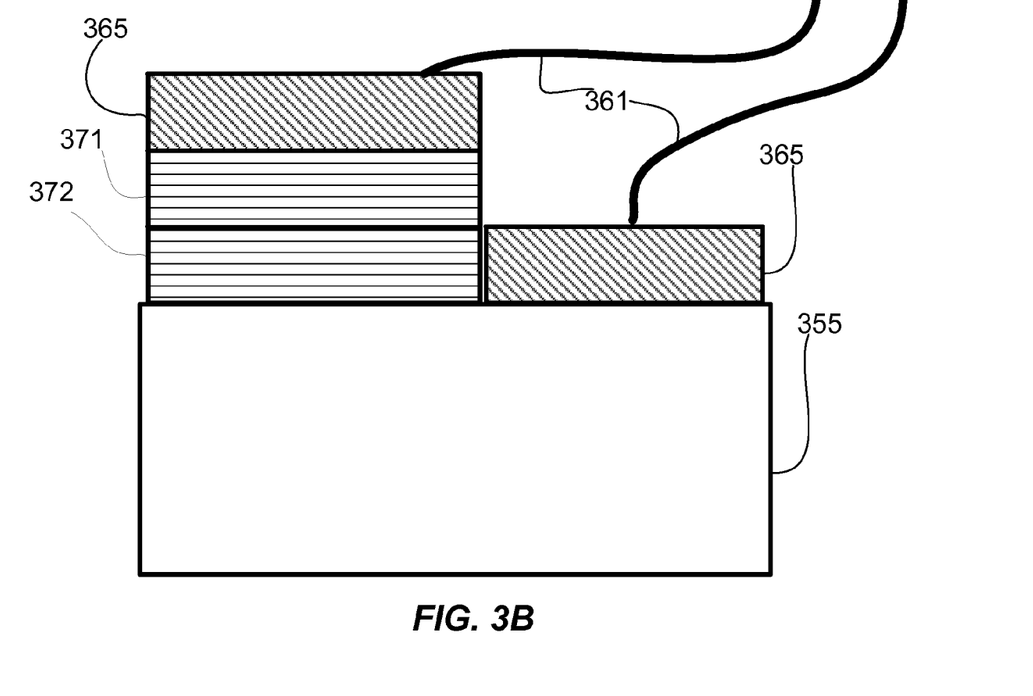

FIGS. 3A-3B are additional cross-sectional schematics of a substrate processing system and a light emitting component according to embodiments of the invention. An LED assembly 325 is again positioned above substrate 300 in chamber 305. Electrical connections 324 are fed through lid 320 and deliver power to the array of LEDs which illuminate and heat the front 301 of substrate 300. Pyrometers 335-1 and 335-2 again determine the temperature of the substrate 300 at a variety of multiple locations on the back 302 and front 301 of the substrate 300. In this embodiment, power may be distributed through wires printed on the top of the LED assembly 325.

A representative element in the array of LEDs, in this disclosed embodiment, are shown in FIG. 3B. Electrical leads 361 are attached to the top of an LED stack through conducting pads 365 (two shown). A higher voltage may be applied to, for example, the conducting pad on the left relative to the conducting pad on the right creating a voltage difference at the interface between a p-doped gallium nitride layer 371 and an n-doped gallium nitride layer 372 causing light to be emitted from the active region 355. Illumination from the active region 355 propagates is not bounded from below in this case and will generally emit light downward toward the substrate 300 of FIG. 3A. This architecture allows a two-dimensional array of LEDs to be assembled more simply and typically with greater density than that of FIGS. 2A-B. Both electrical connections are made from above and the LED elements can be formed on a large substrate which may then be left uncleaved and used as an integrated unit to illuminate and heat substrate 300. The transparent substrate used to manufacture the LED assembly 325 is of the same size as the substrate, in an embodiment, and may be used to illuminate and heat the top 301 of the substrate 300 all at once.

In all these exemplary embodiments, the LEDs may be separated into zones each with different optical pulse durations, shapes and intensities in order to provide even heating of a substrate. Portions of substrates closer to the edge typically cool and heat differently than portions near the center, making zone control desirable especially for pulses longer than 20 milliseconds. In embodiments relevant for circular substrates (wafers), the zones are partitioned based on distance from the center of the wafer.

Figure 4:
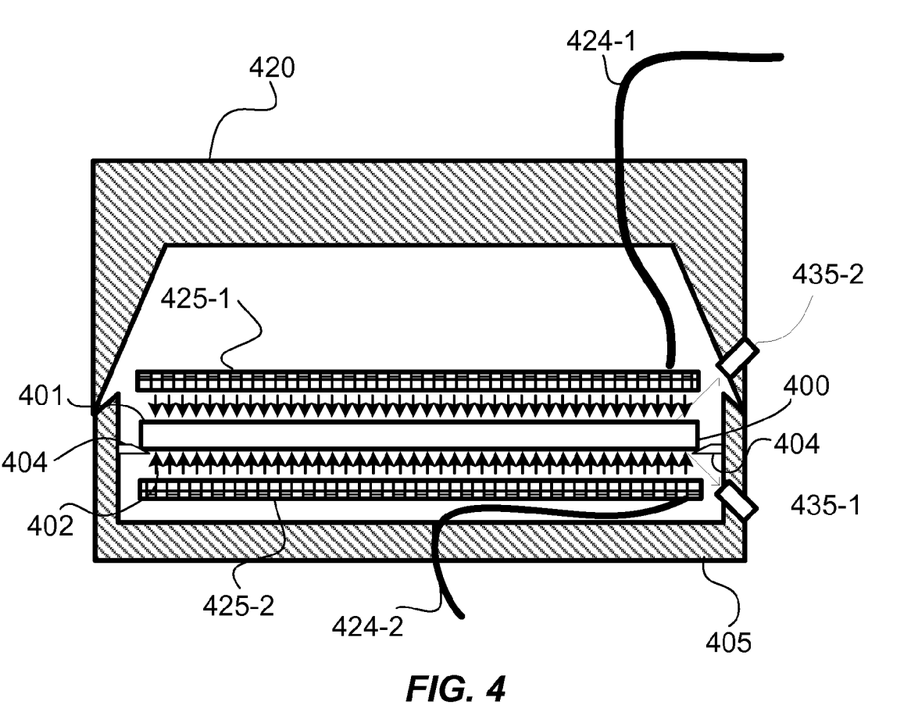
FIG. 4 is a cross-sectional schematic of a substrate processing system according to embodiments of the invention.

FIG. 4 is a cross-sectional schematic of a substrate processing system according to embodiments of the invention. Two LED assemblies 425-1 and 425-2 are used to heat substrate 400. An LED assembly 425-1 is again positioned above substrate 400 in chamber 405 whereas the second LED assembly 425-2 is positioned below the substrate 400 in chamber 405. The first LED assembly 425-1 is used to heat the top 401 of the substrate 400 whereas the second LED assembly 425-2 is used to heat the bottom 402 of substrate 400. Two sets of electrical connections 424-1 and 424-2 are fed through lid 420 and chamber 405, respectively, to deliver power to the arrays of LEDs which illuminate and heat both surfaces of substrate 400. Pyrometers 435-1 and 435-2 again determine the temperature of substrate 400 at a variety of multiple locations on the back 402 and front 401 of the substrate 400. The positions of pyrometers 435-1 and 435-2 are adjusted to provide unobstructed access to the surfaces.

A substrate may be processed by LEDs in combination with other light sources, e.g. tungsten halogen lamps. LEDs may be utilized to heat the substrate from near room temperature up to a low processing temperature, sufficient for some substrate processes. Additional processes, requiring even higher temperatures, may employ tungsten-halogen lamps to achieve those higher temperatures. Elevating the substrate to the low processing temperature can enhance absorption of the light emitted by the incandescent tungsten-halogen lamps enhancing their heating efficiency. LEDs and complementary radiation sources may be combined in one optical assembly, or a substrate processing system, or they may be implemented in separate assemblies.

Exemplary Substrate Processing System

Figure 5:
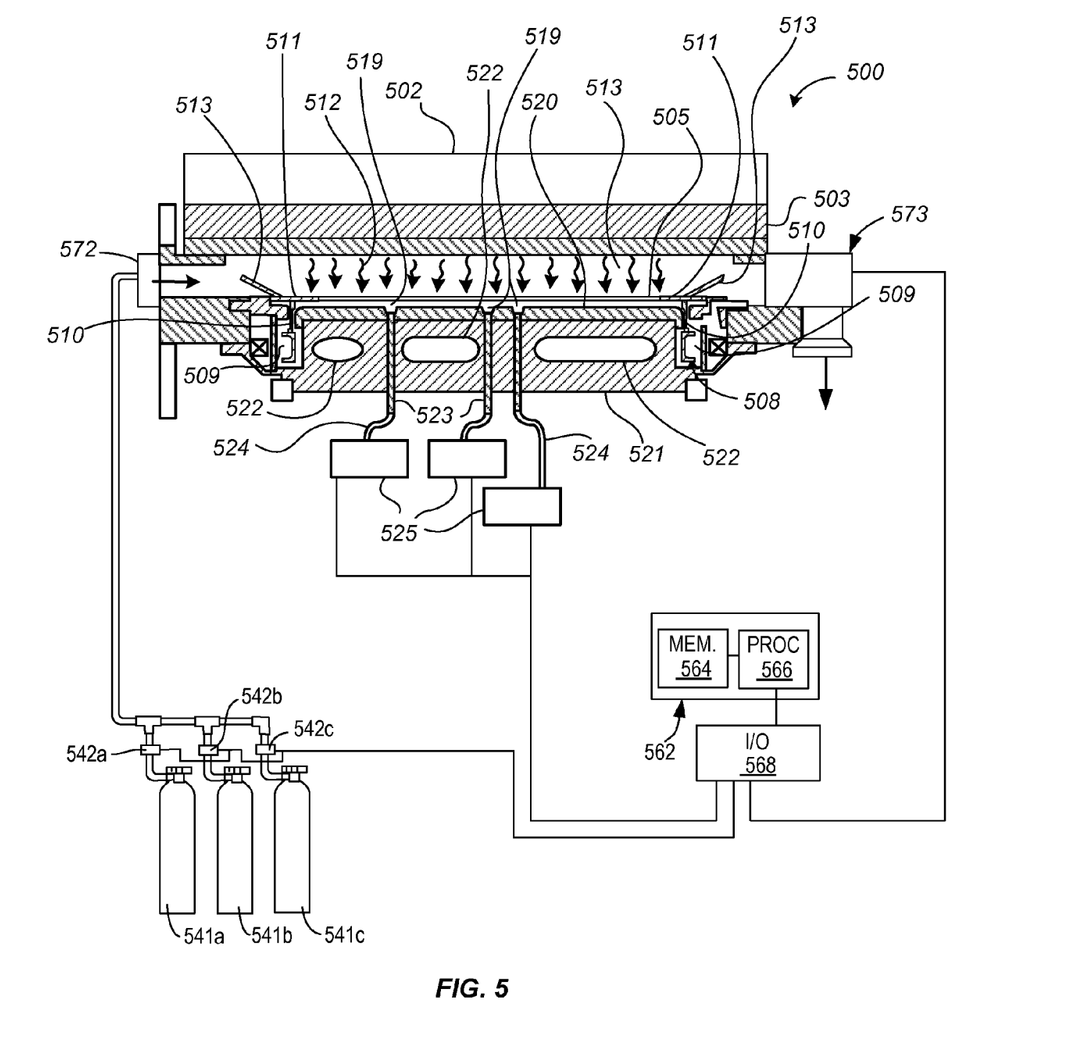
FIG. 5 is a cross-sectional view of an exemplary substrate processing system which benefits from embodiments of the invention.

FIG. 5 shows a substrate processing system including processing chamber 500 for processing disk-shaped substrates 505 which may be twelve-inch (300 millimeter (mm)) diameter silicon (Si) wafers.

During processing, the substrate 505 is supported inside chamber 500 on a substrate support assembly 508 and is heated by illumination element 502 located directly above substrate 505, in accordance with an embodiment of the invention. Illumination element 502 generates radiation 512 which may enter processing chamber 500 through a water-cooled quartz window assembly 503. The gap between the window assembly 503 and the substrate 505 may be adjustable and is between about 10 and 50 millimeters (mm) in embodiments. Beneath substrate 505 is a reflector 520 which is mounted on a central assembly 521 having a generally cylindrical base. Reflector 520 may possess a highly reflective surface coating. The underside of substrate 505 and the top of reflector 520 border a reflecting cavity for enhancing the effective emissivity of substrate 505. The separation between substrate 505 and reflector 520 may also be adjusted. In 300 mm substrate processing systems, the gap may be between about 3 mm and 20 mm or between about 5 mm and 8 mm in different embodiments.

Multiple temperature probes (three shown in FIG. 5) may employ pyrometric methods to monitor the temperature in different regions of substrate 505 from the underside by collecting light through light pipes 523 and measuring the intensity of the detected light with optical sensors 525 and ancillary electronics. Each temperature probe may include a light pipe 523 inserted into a conduit that passes from the backside of central assembly 521 through the top of reflector 520. Light pipes 523 may be 0.080 inch in diameter and the conduits are slightly larger to facilitate insertion of light pipes 523 into the conduits. Light pipes 523 can be optically connected to optical sensors 525 via fiber optics 524. The temperature probes produce signals indicative of the measured temperature near regions of the substrate and the signals may be a system controller 562.

A processing region 513 is located above substrate 505. The substrate is modified by shining light 512 from illumination element 502 towards substrate 505 which may reorder the substrate and/or assist chemical reactions involving process gases and substrate 505. For example, dopants within the substrate 505 may be activated or dispersed, the degree of order in the substrate 505 may be increased or a film (such as a silicide, nitride or oxide) may be grown on the substrate 505. An inlet manifold 572 is positioned in the side wall of chamber 500 and is adapted to admit gas from a source of gas or gases, such as tanks 541, into the chamber 500. The flow of gases from tanks 541 are preferably independently controlled with manual valves and computer controlled flow controllers 542. An exhaust cap 573 is positioned in the side of chamber 500 diametrically opposite inlet manifold 572 and is adapted to exhaust process effluents from the deposition chamber 500 into a pumping system (not shown).

Central assembly 521 includes a circulation circuit including interior chambers 522 coupled to coolant inlets (not shown) through which a cooled fluid circulates in order to cool central assembly 521. Room temperature water is used in an embodiment to maintain central assembly 521 well below the temperature of heated substrate 505. The temperature of central assembly 521 is kept below 150° C. in embodiments.

Small reflective cavities 519 may be formed in the top of reflector 520 where light pipes 523 pass through the top of the reflector 520. The light pipes 523 are positioned such that their uppermost ends are flush with or slightly below the entrance to each microcavity 519.

Light pipes 523 may be made of a high optical index material such as sapphire. Sapphire light pipes are generally preferred as they have relatively small light scattering coefficients, and they tend to have greater transverse light rejection. As a result they provide greater measurement localization because they accept incoming rays from a smaller solid angle and thus a smaller area of measurement. The light pipes can be made of any appropriate heat-tolerant and corrosion-resistant material, e.g., quartz, which can transmit the sampled radiation to the pyrometer possibly through intervening fiber optic cables 524. Alternatively, the radiation sampling system could be an optical system that includes a small-radius objective lens mounted in reflector 520 and a system of mirrors and lenses which communicate radiation collected by each lens to each pyrometer. Such a scheme may be less expensive than sapphire light pipes if appropriate off-the-shelf optical elements are available. Alternatively, light pipes can be made from a tube that has a highly polished reflective inner surface.

As indicated above, although only three temperature probes are shown in FIG. 5, an actual system may use seven or eight measurement probes distributed over reflector 520 so as to measure the temperature at different radial and azimuthal positions. During thermal processing, substrate support assembly 508 is often rotated to even the heat distribution of the substrate 505. The substrate support assembly 508 can also be moveable so that its distance away from the light emitting diodes can be adjusted. Rotation rates may be between about 20 and 200 revolutions per minute (RPM). In cases where the substrate 505 is rotated, each probe actually samples the temperature profile of a corresponding annular ring area on the substrate. Substrate support assembly 508 may be a magnetically-levitated rotating frame. Substrate support assembly 508 may extend into a rotor well 509 while supporting the substrate 505 from the edge. In this way, substrate 505 is rotated under illuminating element 502 to promote substrate 505 temperature uniformity.

Along the inner diameter of edge ring 511 may be a shelf or wedge shape for contacting substrate 505. Edge ring 511 contacts the substrate 505 around the outer perimeter of substrate 505, thereby obscuring a minimal portion of the underside of substrate 505. Edge ring 511 has a radial width of approximately 0.75 inch. Portions of edge ring 511 are close to substrate 505 and may be subject to corroded or contaminated by process gases selected to form a film or otherwise modify substrate 505. The material used for edge ring 511 may be resistant to chemical attack such as silicon carbide.

Edge ring 511 is designed to create a light tight seal with a cylinder 510. Extending from the bottom surface of edge ring 511 is a cylindrically-shaped lip or skirt which has an outside diameter that is slightly larger or smaller than the outside diameter of cylinder 510 preventing light from traveling directly between the regions outside and inside the cylinder

510. Edge ring 511 has an outer radius that is larger than the radius of cylinder 510 so that it extends out beyond cylinder 510. This annular extension of edge ring 511 beyond cylinder 510 functions as a baffle which prevents stray light from entering reflecting cavity 519 and misinterpreted as being indicative of substrate temperature. To further reduce the possibility of stray light entering reflecting cavity 519, edge ring 511 may be coated with a material that absorbs the radiation generated by illuminating element 502 (e.g., a black or grey material such as silicon carbide). To further reduce the amount of stray light entering reflecting cavity 519, a co-rotating edge ring extension 513 may be used. Cylinder 510 may be made of quartz and may be coated with Si to further limit the intrusion of light into the reflecting cavity 519.

The substrate processing system illustrated in FIG. 5 includes a system controller 562 which controls various operations of substrate processing system such as controlling illuminating element 502 intensities, gas flows, substrate temperature, and chamber pressure. In an embodiment of the present invention the system controller 562 includes a hard disk drive (memory 564) and a processor 966. The processor contains a single board computer (SBC), analog and digital input/output boards 568 as well as mechanical interface boards.

System controller 562 controls the activities of the substrate processing system. The system controller executes system control software, which is a computer program stored in a computer-readable medium such as a memory 564. Memory 564 may be a hard disk drive, but memory 564 may also include DRAM, flash and other kinds of memory. Memory 964 may also be a combination of one or more types of memory. The computer program includes sets of instructions that dictate the timing, mixture of gases, chamber pressure, chamber temperature, lamp power levels, substrate support assembly position, and other parameters of a particular process. Of course, other computer programs such as one stored on another memory device including, for example, a floppy disk or another appropriate drive, may also be used to operate system controller 562. Input/output (I/O) devices 568, in addition to interfacing with the equipment, may include human interface devices such as an LCD monitor, a keyboard and a pointing device. System controller 562 may be connected to a network to allow remote control or monitoring of system functions. Control may also be distributed among multiple system controllers 562 which communicate over a network in order to distribute control responsibilities.

Figure 6:
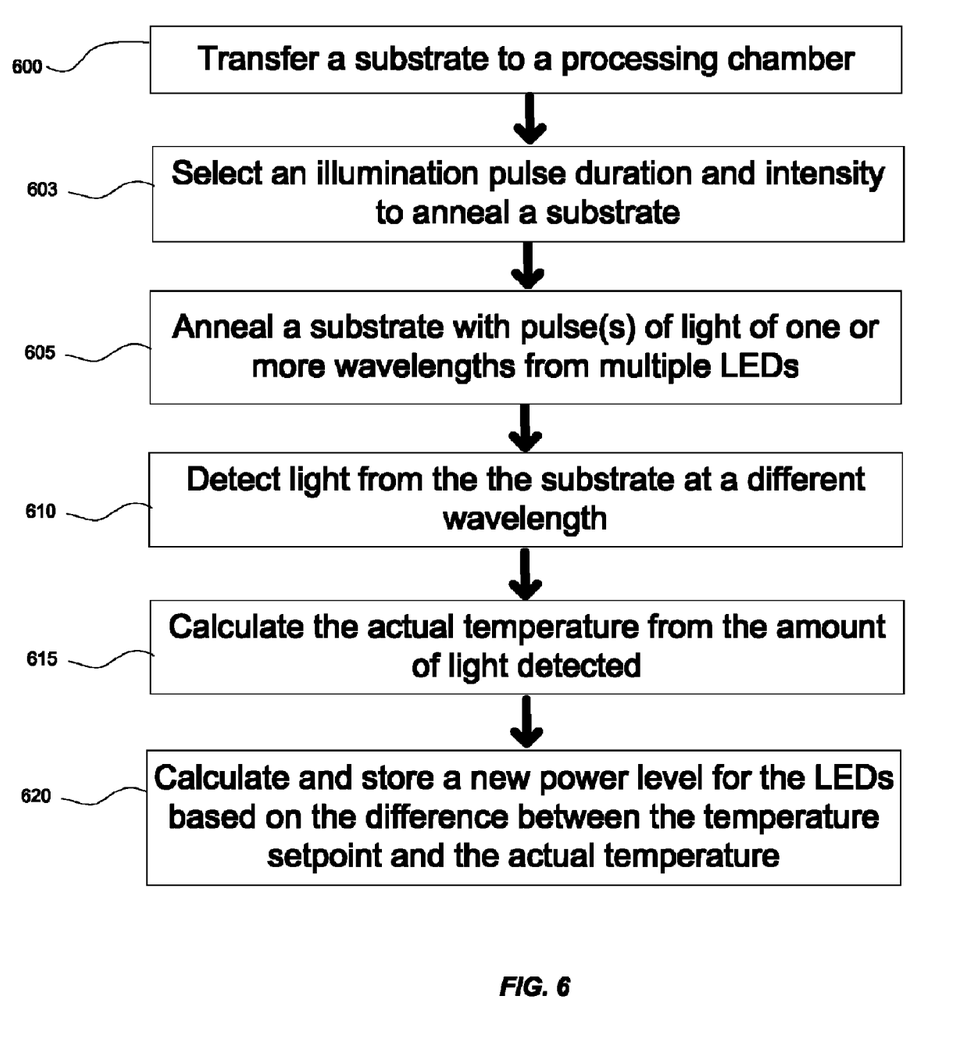
FIG. 6 is a flowchart showing an exemplary method which may be used to treat the surface of a substrate according to disclosed embodiments.

FIG. 6 is a flowchart showing an exemplary method which may be used to treat the surface of a substrate according to disclosed embodiments. A substrate is transferred into a processing chamber (operation 600). An illumination pulse duration and intensity are chosen so the pulse(s) have sufficient power to anneal a substrate (operation 603). An optical assembly, which is part of a substrate processing system, including multiple LEDs illuminates and heats a surface of the substrate (operation 605) to anneal the substrate to a set point temperature. A pyrometer is used to detect radiation from the substrate (operation 610) during the anneal and calculate the actual temperature (operation 615) from the quantity of radiation emitted near a wavelength which is different from the wavelength(s) emitted by the LEDs. Using separate wavelengths for illumination and pyrometry improves the accuracy of the temperature determined by the pyrometer. A new power level is calculated (operation 620) and stored based on the difference between the actual temperature and the set point temperature. The new power level may be used to process subsequent substrates. In an alternative embodiment, the difference is used within a real-time feedback loop to adjust the LED power during processing of the substrate.

As used herein "substrate" may be a support substrate with or without layers formed thereon. Some or all the layers and even the substrate may be patterned. The support substrate may be an insulator or a semiconductor of a variety of doping concentrations and profiles and may, for example, be a semiconductor substrate of the type used in the manufacture of integrated circuits. Use of the terms "light", "optical" and "optics" does not carry any implication that the electromagnetic radiation involved must be from the visible portion of the spectrum. The light can be of any wavelength.

In one embodiment a substrate processing system, includes a plurality of light emitting diodes including a first light emitting diode and a second light emitting diode, the plurality of light emitting diodes heats a first surface of a semiconductor substrate to at least 200° C. The first light emitting diode emits a first plurality of pulses of light energy and the second light emitting diode emits a second plurality of pulses of light energy.

In another embodiment of the substrate processing system, the first plurality of pulses of light and the second plurality of pulses of light have a duration that is less than or equal to one second.

In yet another embodiment of the substrate processing system, the plurality of light emitting diodes are arranged in a pattern that substantially uniformly heats the semiconductor substrate. The pattern can be concentric circles, and the energy output of the plurality of light emitting diodes on each concentric circle can be varied to uniformly heat the first surface of the semiconductor substrate.

In yet another embodiment of the substrate processing system, the pattern is a concentric circle near an outer edge of the semiconductor substrate.

In yet another embodiment of the substrate processing system, the illumination from the plurality of light emitting diodes modifies a near surface region of the semiconductor substrate.

In yet another embodiment of the substrate processing system, the first plurality of pulses of light and the second plurality of pulses of light have a duration ranging from about 1 millisecond to about 1 second.

In yet another embodiment of the substrate processing system, the first plurality of pulses of light and the second plurality of pulses of light have a duration ranging from about 10 microseconds to about 1 millisecond.

In yet another embodiment of the substrate processing system, the first plurality of pulses of light and the second plurality of pulses of light have a peak optical power greater than 500 Watts/cm$^2$.

In yet another embodiment of the substrate processing system, the area of the first surface of the semiconductor substrate is greater than 100 cm$^2$.

In yet another embodiment of the substrate processing system, the plurality of light emitting diodes are formed on a single transparent substrate.

In another embodiment, a substrate processing system, includes a substrate support assembly that supports a semiconductor substrate disposed within a processing chamber, and a first light emitting diode assembly which includes a plurality of light emitting diodes including a first light emitting diode and a second light emitting diode, the plurality of light emitting diodes heats a first surface of a semiconductor substrate to at least 200° C. The first light emitting diode emits a first plurality of pulses of light energy and the second light emitting diode emits a second plurality of pulses of light energy. The plurality of light emitting diodes are arranged in a pattern that substantially uniformly heats the semiconductor substrate. The plurality of light emitting diodes can modify a near surface region of the semiconductor substrate. The pulses of light can have a duration ranging from about 1 millisecond to about 1 second. The first plurality of pulses of light and the second plurality of pulses of light can have a peak optical power that is greater than 200 Watts/cm$^2$. The first plurality of pulses of light and the second plurality of pulses of light can activate a dopant within the semiconductor substrate. The first plurality of pulses of light and the second plurality of pulses of light can diffuse atoms into the semiconductor substrate. The substrate processing system can further include a second light emitting diode assembly including a second plurality of light emitting diodes disposed near a second surface of the semiconductor substrate to illuminate and heat the second surface of the semiconductor substrate.

In another embodiment, a substrate processing system, includes a substrate support assembly that supports a semiconductor substrate disposed within a processing chamber, and a first light emitting diode assembly, which includes a plurality of light emitting diodes including a first light emitting diode and a second light emitting diode, the plurality of light emitting diodes heats a first surface of a semiconductor substrate to at least 200° C. The first light emitting diode emits a first plurality of pulses of light energy including one or more first processing wavelengths and the second light emitting diode emits a second plurality of pulses of light energy including one or more second processing wavelengths. The plurality of light emitting diodes are arranged in a pattern that substantially uniformly heats the semiconductor substrate. The substrate processing system further includes at least one pyrometer that detects light near at least one pyrometric wavelength to determine a temperature of a portion of the semiconductor substrate, wherein the at least one pyrometric wavelength is different from one or more first and second processing wavelengths. The one or more first and second processing wavelengths can include a wavelength below about 0.75 µm and the at least one pyrometric wavelength include a wavelength above about 0.75 µm. The one or more first and second processing wavelengths can include a wavelength below about 0.50 µm and the at least one pyrometric wavelength include a wavelength above about 0.50 µm.

In another embodiment, a method of treating a substrate includes providing a semiconductor substrate, selecting an LED pulse duration and a LED pulse intensity of at least one optical pulse sufficient to treat a semiconductor substrate, and heating the semiconductor substrate to at least 200° C. with at least one optical pulse of light from an LED assembly. The at least one optical pulse includes one or more LED wavelengths. The method can further include receiving an emitted light from the surface of the semiconductor substrate, and determining an intensity of the emitted light near a process monitoring wavelength, wherein the process monitoring wavelength is different from the one or more LED wavelengths. Treating the semiconductor substrate can include annealing the semiconductor substrate. Treating the semiconductor substrate can include diffusing dopants within the semiconductor substrate.

It will also be recognized by those skilled in the art that, while the invention has been described above in terms of preferred embodiments, it is not limited thereto. Various features and aspects of the above-described invention may be used individually or jointly. Further, although the invention has been described in the context of its implementation in a particular environment and for particular applications, those skilled in the art will recognize that its usefulness is not limited thereto and that the present invention can be utilized in any number of environments and implementations.

What is claimed is:

1. A system for thermally processing semiconductor substrates, comprising:
an optical assembly that includes an array of light emitting diodes configured to emit pulses of light having a duration ranging from about 1 millisecond to about 1 second to illuminate an entire upper surface of a semiconductor substrate and to rapidly and substantially uniformly heat the entire upper surface of the semiconductor substrate to at least 200° C. to anneal the semiconductor substrate.

2. The system of claim 1 wherein the pulses of light have a duration that is less than or equal to one second.

3. The system of claim 1 wherein the light emitting diodes are arranged in a pattern that provides the substantially uniformly heating of the upper surface of the semiconductor substrate.

4. The system of claim 3 wherein:
the pattern is concentric circles; and
energy output of the light emitting diodes from each concentric circle can be varied to provide the substantially uniformly heating of the upper surface of the semiconductor substrate.

5. The system of claim 3 wherein the pattern includes a concentric circle near an outer edge of the semiconductor substrate.

6. The system of claim 1 wherein illumination from the light emitting diodes modifies a region near the surface of the semiconductor substrate.

7. The system of claim 1 wherein the pulses of light have a peak optical power greater than 500 Watts/cm$^2$.

8. The system of claim 1 wherein an area of the upper surface of the semiconductor substrate is greater than 100 cm$^2$.

9. The system of claim 1 wherein the light emitting diodes are formed disposed on a single transparent substrate.

10. A system for thermally processing semiconductor substrates, comprising:
a processing chamber;
a substrate support assembly configured to support a semiconductor substrate disposed within the processing chamber; and
an optical assembly that includes a first light emitting diode assembly, the first light emitting diode assembly comprising:
a first array of light emitting diodes configured to emit pulses of light having a duration ranging from about 1 millisecond to about 1 second to illuminate an entire upper surface of the semiconductor substrate at a substantially normal incidence, wherein the first array of light emitting diodes is arranged in a pattern that rapidly and substantially uniformly heats the entire upper surface of the semiconductor substrate to at least 200° C. to anneal the semiconductor substrate.

11. The system of claim 10 wherein illumination from the first array of light emitting diodes modifies a region near the upper surface of the semiconductor substrate.

12. The system of claim 10 wherein the pulses of light have a peak optical power that is greater than 200 Watts/cm$^2$.

13. The system of claim 10 wherein the pulses of light activate a dopant within the semiconductor substrate.

14. The system of claim 10 wherein the optical assembly further comprises a second light emitting diode assembly, the second light emitting diode assembly comprising a second array of light emitting diodes disposed near a bottom surface of the semiconductor substrate, the second array of light emitting diodes configured emit pulses of light having a duration ranging from about 1 millisecond to about 1 second to illuminate the bottom surface of the semiconductor substrate.

15. A system for thermally processing semiconductor substrates, comprising:
a processing chamber;
a substrate support assembly configured to support a semiconductor substrate disposed within the processing chamber; and
an optical assembly comprising:
a plurality of light emitting diodes comprising a first light emitting diode and a second light emitting diode, the plurality of light emitting diodes configured to heat a first surface of the semiconductor substrate to at least 200° C. to anneal the semiconductor substrate;
wherein the first light emitting diode emits a first plurality of pulses of light energy having a duration ranging from about 1 millisecond to about 1 second and comprising one or more first processing wavelengths and the second light emitting diode emits a second plurality of pulses of light energy having a duration ranging from about 1 millisecond to about 1 second and comprising one or more second processing wavelengths;
wherein the plurality of light emitting diodes are arranged in a pattern that rapidly and substantially uniformly heats an entire upper surface of the semiconductor substrate; and
at least one pyrometer configured to detect light near at least one pyrometric wavelength to determine a temperature of a portion of the semiconductor substrate, wherein the at least one pyrometric wavelength is different from the one or more first processing wavelengths and the one or more second processing wavelengths.

16. The system of claim 15 wherein the one or more first and second processing wavelengths comprise a wavelength below about 0.75 μm and the at least one pyrometric wavelength comprise a wavelength above about 0.75 μm.

17. The system of claim 15 wherein the one or more first and second processing wavelengths comprise a wavelength below about 0.50 μm and the at least one pyrometric wavelength comprise a wavelength above about 0.50 μm.

18. A method of thermally processing a semiconductor substrate comprising:
providing the semiconductor substrate;
rapidly and substantially uniformly heating an entire upper surface of the semiconductor substrate to at least 200° C. using an optical assembly that includes an array of light emitting diodes that emit pulses of light having a duration ranging from about 1 millisecond to about 1 second to illuminate the entire upper surface of the semiconductor substrate;
wherein the pulses of light comprise one or more LED wavelengths.

19. The method of claim 18 further comprising:
receiving an emitted light from the surface of the semiconductor substrate;
determining an intensity of the emitted light near a process monitoring wavelength, wherein the process monitoring wavelength is different from the one or more LED wavelengths.

20. The method of claim 18 wherein substantially uniformly heating the semiconductor substrate anneals the semiconductor substrate.

21. The method of claim 18 wherein substantially uniformly heating the semiconductor substrate diffuses dopants within the semiconductor substrate.

22. The system of claim 1 wherein the optical assembly includes tungsten halogen lamps, the optical assembly configured to use the array of light emitting diodes to heat the upper surface of the semiconductor substrate to a first temperature and to use the tungsten halogen lamps to heat the upper surface of the semiconductor substrate to a second temperature greater than the first temperature.

23. The system of claim 10 wherein the optical assembly includes tungsten halogen lamps, the optical assembly configured to use the first array of light emitting diodes to heat the upper surface of the semiconductor substrate to a first temperature and to use the tungsten halogen lamps to heat the upper surface of the semiconductor substrate to a second temperature greater than the first temperature.

24. The system of claim 15 wherein the optical assembly further comprises tungsten halogen lamps, the optical assembly configured to use the plurality of light emitting diodes to heat the upper surface of the semiconductor substrate to a first temperature and to use the tungsten halogen lamps to heat the upper surface of the semiconductor substrate to a second temperature greater than the first temperature.

25. The method of claim 18 wherein the optical assembly includes tungsten halogen lamps, the optical assembly configured to use the array of light emitting diodes to heat the upper surface of the semiconductor substrate to a first temperature and to use the tungsten halogen lamps to heat the upper surface of the semiconductor substrate to a second temperature greater than the first temperature.

* * * * *